United States Patent
Kim et al.

(10) Patent No.: US 9,350,390 B2
(45) Date of Patent: May 24, 2016

(54) ENCODER, DECODER AND SEMICONDUCTOR DEVICE INCLUDING THE SAME

(71) Applicant: SK hynix Inc., Icheon-si Gyeonggi-do (KR)

(72) Inventors: Joon-Woo Kim, Icheon-si (KR); Hong-Sik Kim, Seongnam-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 156 days.

(21) Appl. No.: 14/254,060

(22) Filed: Apr. 16, 2014

(65) Prior Publication Data

US 2014/0317468 A1 Oct. 23, 2014

(30) Foreign Application Priority Data

Apr. 22, 2013 (KR) .................. 10-2013-0043886

(51) Int. Cl.
*H03M 13/00* (2006.01)
*H03M 13/29* (2006.01)
*G06F 11/10* (2006.01)
*H03M 13/15* (2006.01)

(52) U.S. Cl.
CPC ....... *H03M 13/2909* (2013.01); *G06F 11/1012* (2013.01); *H03M 13/152* (2013.01); *H03M 13/1515* (2013.01)

(58) Field of Classification Search
CPC ................. H03M 13/2909; H03M 13/1515; H03M 13/152; G06F 11/1012
See application file for complete search history.

(56) References Cited

U.S. PATENT DOCUMENTS 8,225,180 B2   7/2012   Jiang et al.
8,228,728 B1 *  7/2012   Yang .................. G11C 11/5628
                                                       365/185.03

FOREIGN PATENT DOCUMENTS

KR   1020090101887 A   9/2009

OTHER PUBLICATIONS

Thomas M. Cover, Enumerative Source Encoding, IEEE Transactions on Information Theory, Jan. 1973, pp. 73-77, vol. 19, No. 1.

* cited by examiner

*Primary Examiner* — Sam Rizk
(74) *Attorney, Agent, or Firm* — William Park & Associates Ltd.

(57) ABSTRACT

A semiconductor device may include a first encoding unit configured to encode first data into an anti-drift code, and a second encoding unit configured to add parity information to the anti-drift code.

27 Claims, 12 Drawing Sheets

FIG. 2

| Data (64bit) | Index | Codeword (36cell) |
|---|---|---|
| 0000....0000 | 0 | 000000000111111111222222222<u>22</u>333333333 |
| 0000....0001 | 1 | 000000000111111111222222223<u>2</u>333333333 |
| 0000....0010 | 2 | 000000000111111111222222223<u>2</u>233333333 |
| ... | ... | ... |
| 1111....1101 | 18446744073709551613 | 312301312022212130212302310100031<u>303</u> |
| 1111....1110 | 18446744073709551614 | 312301312022212130212302310100031<u>330</u> |
| 1111....1111 | 18446744073709551615 | 312301312022212130212302310100033<u>013</u> |
| | ... | ... |
| | 2.1453 × 10¹⁹ | 333333333222222222111111111000000000 |

FIG. 3

| Data (64bit) | Codeword (36cell) |
|---|---|
| 1100111000111110001101111101110100010111011000100 01010111111011001 | 201201120201110330003022232133332211 |
| 1100110110010110001001101000001011111011101110110 011000101010101 | 210201120201110330003022232133332211 |

FIG. 12

| Refresh Period | Example1 | Example 2 | Embodiments as discussed |
|---|---|---|---|
| $1 \times 10^4$ sec | 30.1 % | 82.8 % | 20.3 % |
| $1 \times 10^5$ sec | 36.0 % | 82.8 % | 22.3 % |
| $1 \times 10^6$ sec | 39.8 % | 82.8 % | 24.2 % |

ENCODER, DECODER AND SEMICONDUCTOR DEVICE INCLUDING THE SAME

CROSS-REFERENCE TO RELATED APPLICATIONS

The present application claims priority of Korean Patent Application No. 10-2013-0043886, filed on Apr. 22, 2013, which is incorporated herein by reference in its entirety.

TECHNICAL FIELD

Various embodiments generally relate to an encoder, a decoder, and a semiconductor device including the same, and more particularly, to an encoder, a decoder and a semiconductor device including the same, which may be capable of processing data such that data may be recovered.

BACKGROUND

In a memory device such as PCRAM, a drift may occur as time elapses. The drift may indicate a phenomenon whereby information of a memory cell, for example, a resistance value has changed.

When a drift occurs, information read from a memory cell may differ from the original information from when the information was read. Thus, it is not easy to recover the original data. In particular, in the case of a memory device storing multi-bit data, a drift may make it more difficult to recover data. Furthermore, when a crossover occurs between adjacent levels while a drift occurs, it becomes more difficult to recover data.

SUMMARY

In an embodiment, a semiconductor device may include a first encoding unit configured to encode first data into an anti-drift code, and a second encoding unit configured to add parity information to the anti-drift code.

In an embodiment, there may be provided a semiconductor device which decodes an anti-drift code obtained by encoding first data, parity information on the anti-drift code, and input data containing drift noise. The semiconductor device may include: a first decoding unit configured to recover the anti-drift code from the input data and recover the parity information by referring to the recovery information; a second decoding unit configured to output an error-corrected anti-drift code from the recovered parity information and the recovered anti-drift code; and a third decoding unit configured to decode the error-corrected anti-drift code and output the first data.

In an embodiment, a semiconductor device may include: an encoder configured to encode data provided from a host into an anti-drift code, add parity information to the anti-drift code, and output the anti-drift code and the parity information; and a decoder may be configured to recover the anti-drift code and the parity information from information outputted from a semiconductor memory device, generate the error-corrected anti-drift code using the recovered parity information, and decode and output the anti-drift code.

In an embodiment, a semiconductor memory device may include: a memory cell array; an encoder configured to encode data provided from a memory control device into an anti-drift code, add parity information to the anti-drift code, and provide the anti-drift code to the memory cell array; and a decoder may be configured to recover the anti-drift code and the parity information from information outputted from the memory cell array, generate the error-corrected drift code using the recovered parity information, and decode and output the drift code.

BRIEF DESCRIPTION OF THE DRAWINGS

FIG. 2 is a table for explaining the relation between data and codewords in a semiconductor device in accordance with an embodiment.

FIG. 3 illustrates an example in which an error occurs due to a crossover.

FIG. 12 illustrates a simulation result showing the effect of the embodiments.

DETAILED DESCRIPTION

Figure 1:
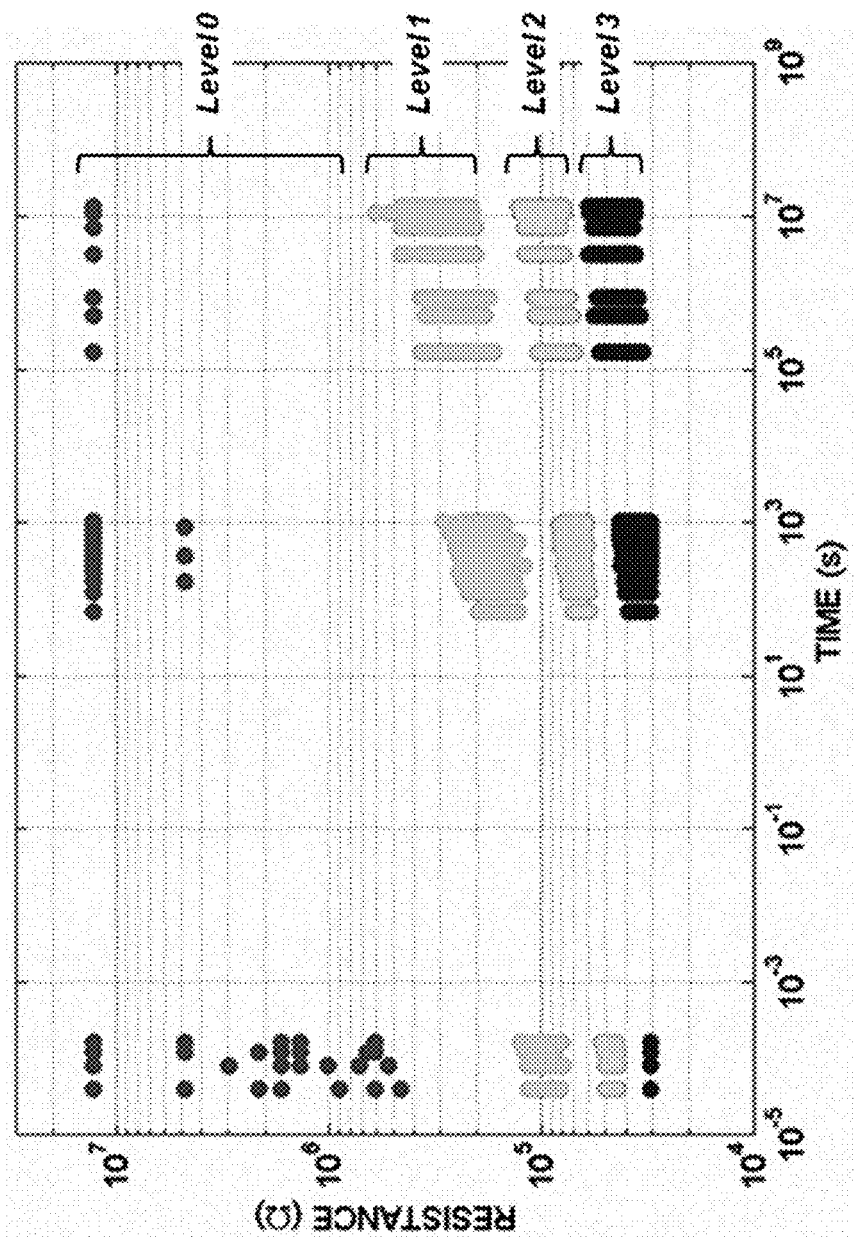
FIG. 1 is a graph illustrating the change in resistance of a PCRAM cell, caused by a drift.

Various embodiments will be described below in more detail with reference to the accompanying drawings. The various embodiments may, however, be embodied in different forms and should not be construed as limited to the embodiments set forth herein. Rather, these embodiments are provided so that this disclosure will be thorough and complete, and will fully convey the scope of the application to those skilled in the art. Throughout the disclosure, like reference numerals refer to like parts throughout the various figures and embodiments.

The present disclosure provides an encoding and decoding technique that may be used for overcoming a drift in a memory device such as PCRAM. However, the memory device is not limited to PCRAM, but the present disclosure may be applied to other volatile or nonvolatile memory devices in which a drift occurs.

FIG. 1 is a graph illustrating the change in resistance of a PCRAM cell, caused by a drift.

In FIG. 1, the PCRAM cell is a multi-level cell capable of storing 2-bit data, and stores four kinds of information such as level 0 (00), level 1 (01), level 2 (10), and level 3 (11). A resistance value corresponding to level 0 may be the largest, and a resistance value corresponding to level 3 may be the smallest.

When a drift occurs, the resistance of a cell is changed in a direction where it increases, as illustrated in FIG. 1. However, although the resistance value of each cell increases, the resistance values corresponding to the respective levels do not overlap each other, and are maintained in a predetermined order. Thus, the level of the cell may be recovered by comparing the measured resistance values of the cell to a boundary value.

In an embodiment, a relative magnitude between the measure resistance values may be used to recover the level, instead of comparing the measured resistance values to the boundary value.

In an embodiment, data to be inputted to the memory device may be encoded as a codeword including M different symbols, each of which includes $N_m$ symbols, and then stored in memory cells, where M, m, and $N_m$ are natural numbers, $1 \le m \le M$, and $N_m$ represents the number of m-th symbols when M symbols are arranged in order of magnitude. Then, the resistance values of the cells, read from the memory device, may be arranged in order of magnitude, levels may be allocated to the resistance values according to the magnitude order, and the resistance values may be rearranged in the original order. Then, the data having been written to the memory device may be recovered.

The above-described codeword is an example of an anti-drift code, and various types of anti-drift codes may exist.

When a drift occurs, magnitudes of resistances may be exchanged between adjacent levels, that is, a crossover may occur.

When a crossover occurs, original data may not be reliably recovered only by performing anti-drift coding.

When a crossover occurs with a drift in the memory cell array, the order of symbols may be changed. Thus, in an embodiment, error correction coding may be additionally applied to recover the order of symbols.

In the following disclosure, an example in which the above-described codeword is used as an anti-drift code will be described. However, the claims are not limited to the case in which the above-described codeword is used as an anti-drift code.

FIG. 2 is a table for explaining the relation between data and codewords.

In FIG. 2, the data are binary-code data, and have a width of 64 bits.

As described above, the codeword may include M different symbols, each of which includes $N_m$ symbols. In the codeword illustrated in FIG. 2, M=4, $N_m$=9 ($1 \le m \le 4$), and four symbols are 0, 1, 2, and 3.

The types of the symbols may correspond to the types of levels stored in one memory cell. Thus, the types M of the symbols may be determined by the number n of bits stored in each cell, as expressed by Equation 1.

$$M=2^n \quad \text{[Equation 1]}$$

In an embodiment, the correlation between data and codewords may be set by the sizes of the data and the sizes of the codewords. That is, as illustrated in FIG. 2, the data may be arranged in a magnitude order from the smallest value to the largest value, and the codewords may be arranged in a magnitude order from the smallest value to the largest value. In FIG. 2, the magnitude order is indicated by indexes.

In an embodiment, a process of encoding data into a codeword may correspond to a process of finding a codeword having the same index as data, and a process of decoding a codeword into data may correspond to a process of finding data having the same index as a codeword.

Thus, in an embodiment, the width L of data and the length of a codeword, that is, the number of cells $$\left( \sum_{m=1}^{m=M} N_m \right)$$

must satisfy the following equation.

$$2^L \le \frac{\left( \sum_{m=1}^{m=M} N_m \right)!}{N_1! \times \ldots \times N_M!} \quad \text{[Equation 2]}$$

FIG. 3 illustrates an example in which an error occurs due to a crossover when the anti-drift coding as illustrated in FIG. 2 is used.

As described above, the crossover indicates a phenomenon in which the positions of two adjacent symbols are exchanged. As illustrated in FIG. 3, although only two symbols are exchanged in the codeword, errors corresponding to a larger number of bits may occur in data obtained by decoding the codeword. Thus, the problem which occurs when symbols of a codeword are exchanged must be solved before the codeword is decoded into data.

In order to solve such a problem, an error correction code may be additionally applied to the codeword after the data is encoded into the codeword.

Hereafter, an encoder which encodes information according to the above-described order and provides the encoded information to a memory cell array and a decoder which decodes information read from the memory cell array and output the decoded information will be disclosed.

In the following disclosure, suppose that each cell of the memory cell array is a multi-level cell to store two bits, and four kinds of symbols, that is, 0, 1, 2, and 3 are stored in each cell.

In an embodiment, each symbol and cell data may have the following relation.

TABLE 1

| symbol | cell data |
|---|---|
| 0 | 00 |
| 1 | 01 |
| 2 | 10 |
| 3 | 11 |

In an embodiment, each symbol and cell data may have the following relation.

TABLE 2

| symbol | cell data |
|---|---|
| 0 | 00 |
| 1 | 01 |
| 2 | 11 |
| 3 | 10 |

Table 2 illustrates an example in which cell data in a gray code are associated with symbols.

In Table 1, when a crossover occurs between two adjacent symbols 1 and 2, four bit errors occur. On the other hand, in table 2, when a crossover occurs between two adjacent symbols 1 and 2, two bit errors occur, and are equal to the number of symbols in which an error occurred, that is, 2.

When the gray code mapping is used as shown in Table 2, it may increase the possibility to prevent the extension of bit error caused by the crossover.

Figure 4:
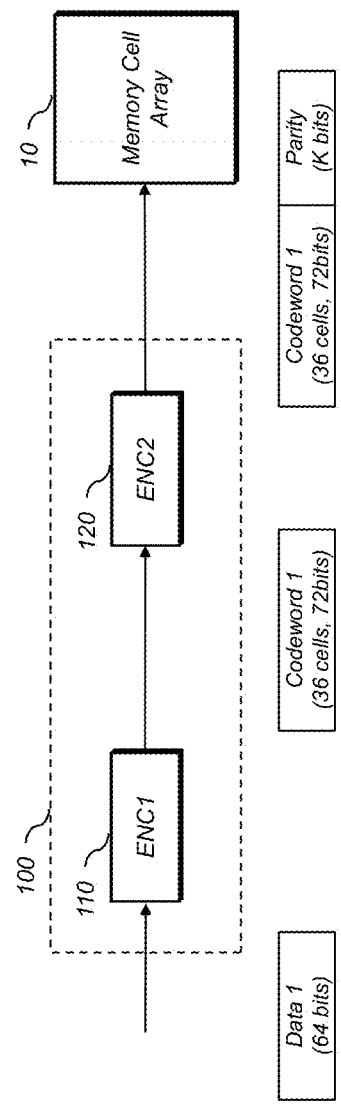
FIG. 4 is a block diagram of an encoder in accordance with an embodiment.

FIG. 4 is a block diagram of the encoder 100 in accordance with an embodiment.

The encoder 100 in accordance with an embodiment may include a first encoding unit 110 and a second encoding unit 120. The first encoding unit 110 may perform anti-drift coding on input data and output a codeword, and the second encoding unit 120 may apply error correction coding to the codeword.

The first encoding unit 110 may encode input data according to the rule illustrated in FIG. 2. For this operation, the first encoding unit 110 may search for a codeword having the same index as the input data. When an anti-drift code different from the above-described codeword is used, the first encoding unit 110 may perform an encoding operation according to the corresponding encoding method.

The second encoding unit 120 may receive the codeword, add parity information to the received codeword, and provide the codeword and the parity information to the memory cell array 10.

The second encoding unit 120 may use various methods such as BCH coding and RS coding, as the error correction coding. According to the BCH coding, the second encoding unit 120 may analyze a codeword in the unit of a bit and add parity bits. According to RS coding, the second encoding unit 120 may analyze a codeword in the unit of a symbol and add a parity symbol. When the number of bits of the added parity information is odd, the second encoding unit 120 may add one arbitrary bit such that the number of bits of the parity information becomes even.

Figure 5:
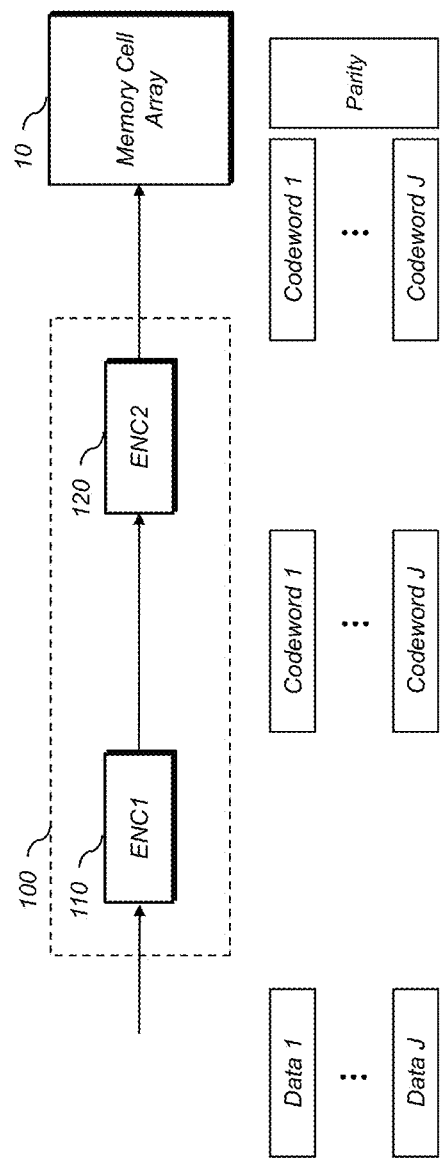
FIGS. 5 and 6 are block diagrams of encoders in accordance with other embodiments.

FIG. 5 illustrates an encoder 100 in accordance with an embodiment.

The encoder 100 illustrated in FIG. 5 may be operated in substantially the same manner as the encoder 100 illustrated in FIG. 4.

The first encoding unit 110 illustrated in FIG. 5 may receive J data and generate J codewords for the respective data, where J is a natural number.

The second encoding unit 120 may generate parity information on the J codewords, add the generated parity information to the J codewords, and provide the J codewords and the parity information to the memory cell array 10.

In an embodiment, the number J of codewords may be selected, which is a unit for generating parity information, by considering the length of the codeword, the bit number of the parity information and the like.

Depending on the type of the error correction code, the second encoding unit 120 may add parity information to a plurality of codewords, as illustrated in FIG. 5. Then, the bit number of parity information required for each codeword may be reduced. The storage space of the memory cell array 10 may be saved.

Figure 6:
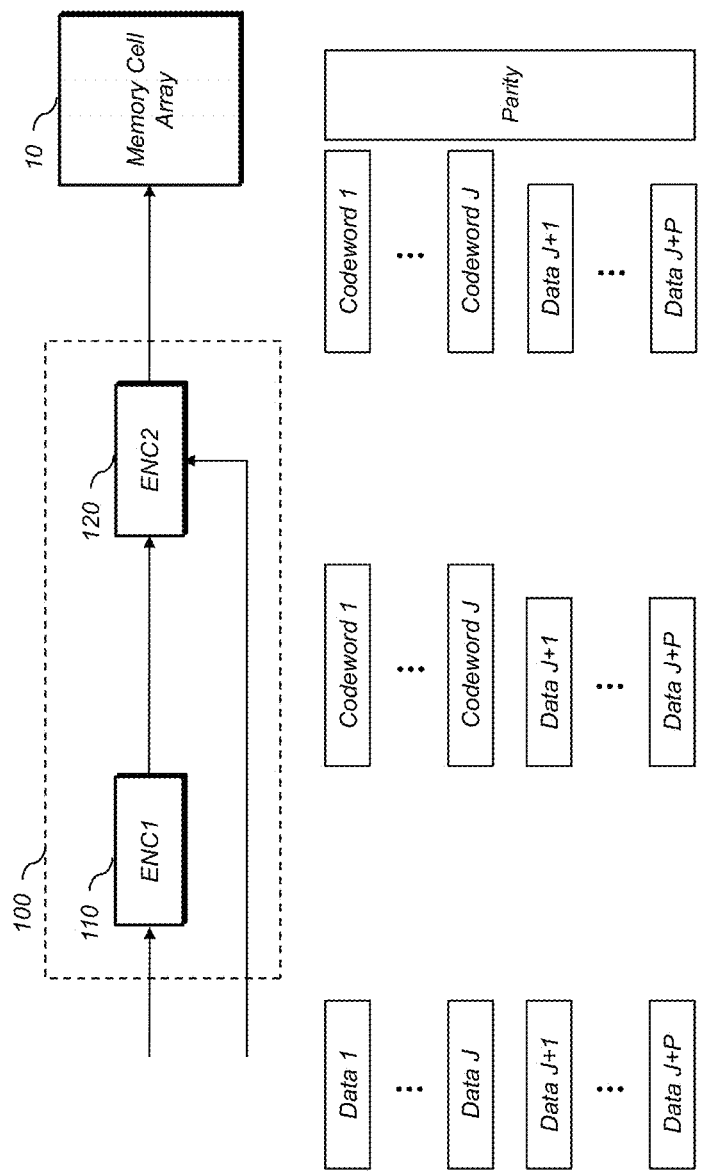

FIG. 6 illustrates an encoder 100 in accordance with an embodiment.

The encoder 100 illustrated in FIG. 6 may be operated in substantially the same manner as the encoder 100 illustrated in FIG. 4.

The first encoding unit 110 illustrated in FIG. 6 may receive J data and generate J codewords for the respective data.

The second encoding unit 120 may generate parity information on the J codewords and P data which are not encoded into codewords, add the generated parity information to the J codewords and the P data, and provide the J codewords, the P data, and the parity information to the memory cell array 10.

Although described below, codewords are necessary, in order to recover data even though a drift occurs during a decoding process. However, all data may not be encoded into codewords, but a part of the data may be stored in the memory cell array 10 in a state where the part of the data is not encoded into codewords. During the decoding process, the codewords may be recovered into data, and the recovery information may be used to recover the data which are not encoded into codewords.

The embodiment of FIG. 6 may save the time required while data are converted into codewords during the encoding process. Furthermore, when the length (72 bits) of the codeword is larger than the length (64 bits) of the data as in an embodiment, the storage space of the memory cell array 10 may be saved.

Figure 7:
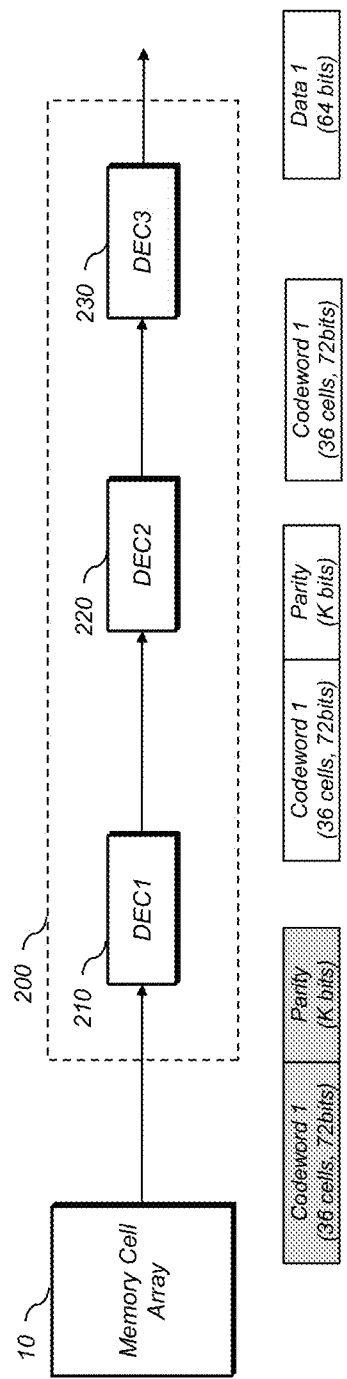
FIG. 7 is a block diagram of a decoder in accordance with an embodiment.

FIG. 7 is a block diagram of the decoder 200 in accordance with an embodiment.

In the embodiment of FIG. 7, suppose that the memory cell array 10 stores information encoded by the encoder 100 illustrated in FIG. 4.

The decoder 200 in accordance with an embodiment may include a first decoding unit 210, a second decoding unit 220, and a third decoding unit 230. The first decoding unit 210 may recover a codeword and parity information from data outputted from the memory cell array 10. The second decoding unit 220 may output an error-corrected codeword from the recovered codeword and parity information. The third decoding unit 230 may convert the codeword into data.

In FIG. 7 and the following drawings, data indicated by gray boxes correspond to data in which noise is generated by a drift.

A resistance value outputted from the memory cell array 10 may have a different value from when data were written to the memory cell array 10, due to a drift. As described above, original information of cell data of which codewords are stored may be easily recovered, even though a drift occurs.

However, the parity information is added by analyzing the codewords in unit of bit or symbol, and no anti-drift code is applied to the parity information. Thus, an additional operation is required to recover original parity information from parity information to which noise is added due to a drift.

First, a codeword may be recovered as follows. In FIG. 7, a codeword is data including four kinds of symbols (0, 1, 2, and 3), of which each includes 9 symbols. As described above, a resistance value corresponding to each symbol is increased due to a drift. Thus, resistance values outputted from 36 cells corresponding to the codeword may be arranged in a magnitude order so as to set symbols corresponding to the resistance values of the respective cells. Therefore, the codeword may be recovered. Then, when the symbol information is converted into bit information, the conversion process used in the encoding process as illustrated in Table 1 or 2 may be applied in the reverse manner.

Next, parity information may be recovered as follows. During the above-described codeword recovery process, the correlation between the resistance values outputted from the cells storing the codeword and the symbol values corresponding to the cells, that is, the recovery information may be accumulated. The resistance values of the cells storing the parity information may be measured and compared to the above-described recovery information. Then, the symbol values of the cells storing the parity information may be derived.

Various methods may be used to derive the symbol values of the cells storing the parity information.

For example, the resistance values of the cells storing the parity information may be compared to the resistance values of the cells storing the codeword, and a symbol value of a cell having the closest resistance value may be determined as a symbol value of a cell storing the parity information (minimum distance method).

Furthermore, statistical data such as average and dispersion of the resistance values may be analyzed for each symbol from the above-described recovery information. Then, a symbol which is the most likely to include a resistance value of a cell storing the parity information may be selected with reference to the analyzed statistical data, and determined as the symbol value of the cell storing the parity information (maximum likelihood method).

The specific method for recovering parity information may be changed in various manners depending on embodiments, and easily designed and changed by those skilled in the art.

The second decoding unit 220 may output an error-corrected codeword from the recovered codeword and parity information. As described above, when a crossover occurs with a drift, symbols may be exchanged, and an error may occur in unit of bit or symbol. Such an error may be corrected by the second decoding unit 220.

The operation of the second decoding unit 220 to correct an error is well-known like the BCH coding method for correcting an error in unit of bit or the RS coding method for correcting an error in unit of symbol may be used. The decoding method of the second decoding unit 220 may be determined according to the encoding method of the second encoding unit 120. As such, the second decoding unit 220 may correct a bit or symbol in which an error occurred due to a crossover, and output an error-corrected codeword.

The third decoding unit 230 may convert the error-corrected codeword into general data. For this operation, the third decoding unit 230 may check the index of the codeword and search for data having the same index as the codeword, as described with reference to FIG. 2. When another type of anti-drift code is used, the specific decoding operation may be performed in a different manner.

Figure 8:
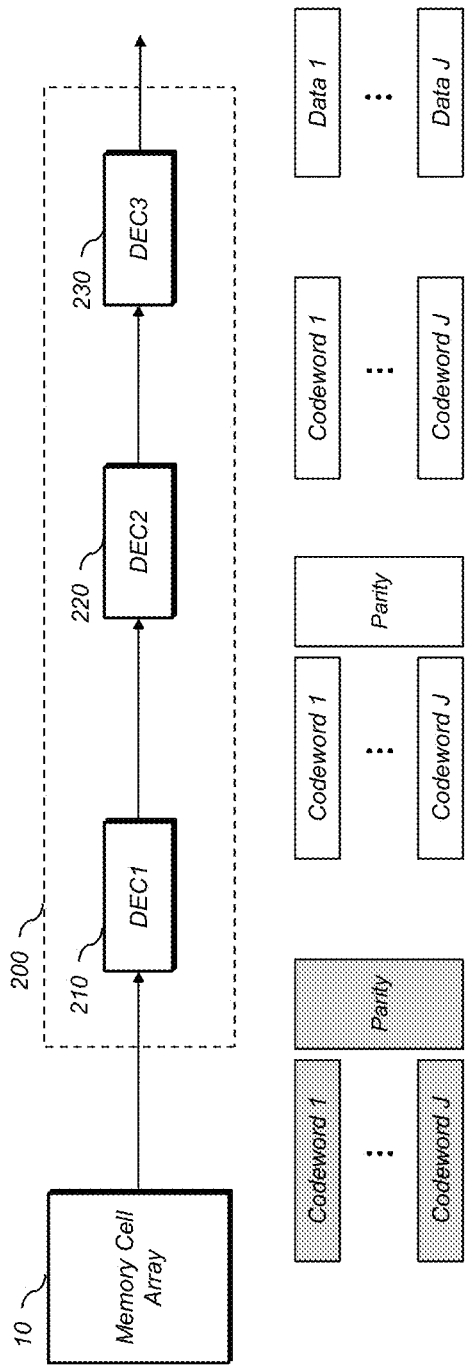
FIGS. 8 and 9 are block diagrams of decoders in accordance with other embodiments.

FIG. 8 illustrates a decoder 200 in accordance with an embodiment.

The decoder 200 of FIG. 8 may correspond to the encoder 100 of FIG. 5. The decoder 200 of FIG. 8 may be operated in substantially the same manner as the decoder 200 of FIG. 7.

In the decoder 200 illustrated in FIG. 8, the first decoding unit 210 may recover parity information by referring to recovery information on codewords 1 to J, the second decoding unit 220 may generate error-corrected codewords 1 to J by referring to the recovery information, and the third decoding unit 230 may decode the codewords 1 to J and output data 1 to J.

Figure 9:
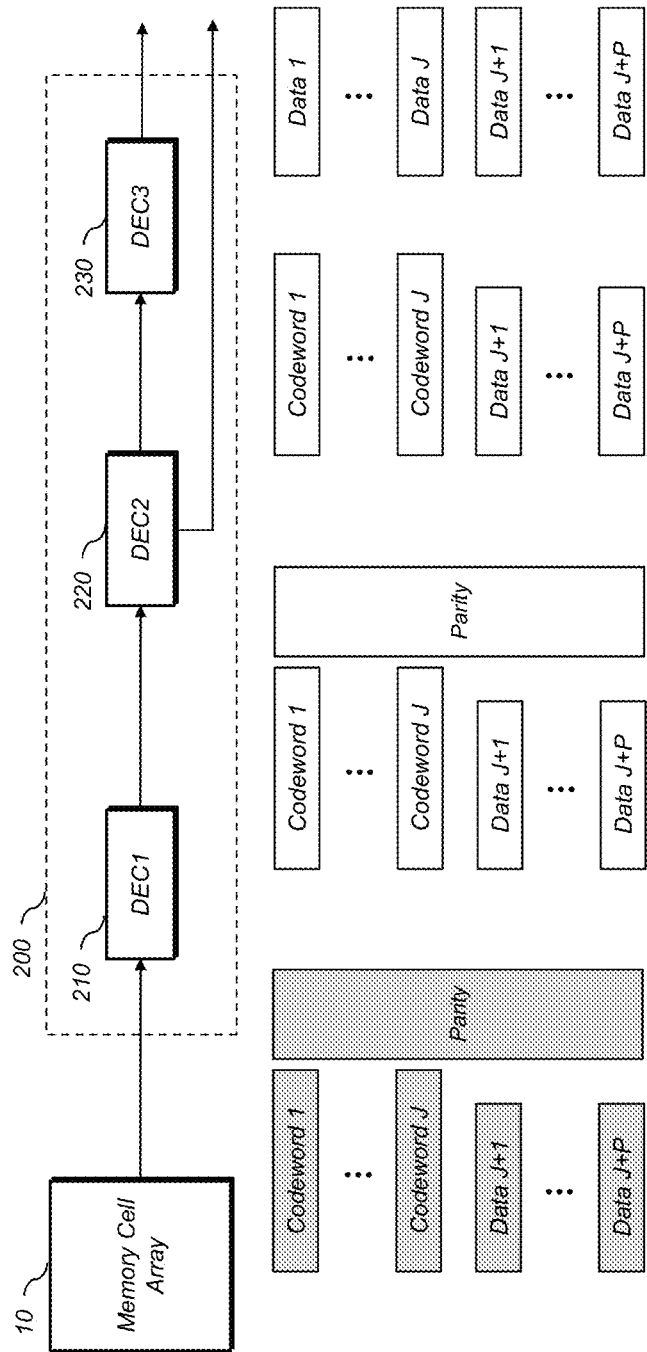

FIG. 9 illustrates a decoder 200 in accordance with an embodiment.

The decoder 200 of FIG. 9 corresponds to the encoder 100 of FIG. 6. The decoder 200 of FIG. 9 may be operated in substantially the same manner as the decoder 200 of FIG. 7.

In the decoder 200 illustrated in FIG. 9, the first decoding unit 210 may recover parity information by referring to recovery information on codewords 1 to J. Like the parity information, data J+1 to J+P are in a state where they are not encoded through an anti-drift code. Thus, the first decoding unit 210 recovers the data J+1 to J+P by referring to the recovery information on the codewords 1 to J.

The second decoding unit 220 may generate error-corrected codewords 1 to J and data J+1 to J+P from the recovered codewords 1 to J and data J+1 to J+P and the parity information.

The third decoding unit 230 may decode the codewords 1 to J and output the data 1 to J.

Figure 10:
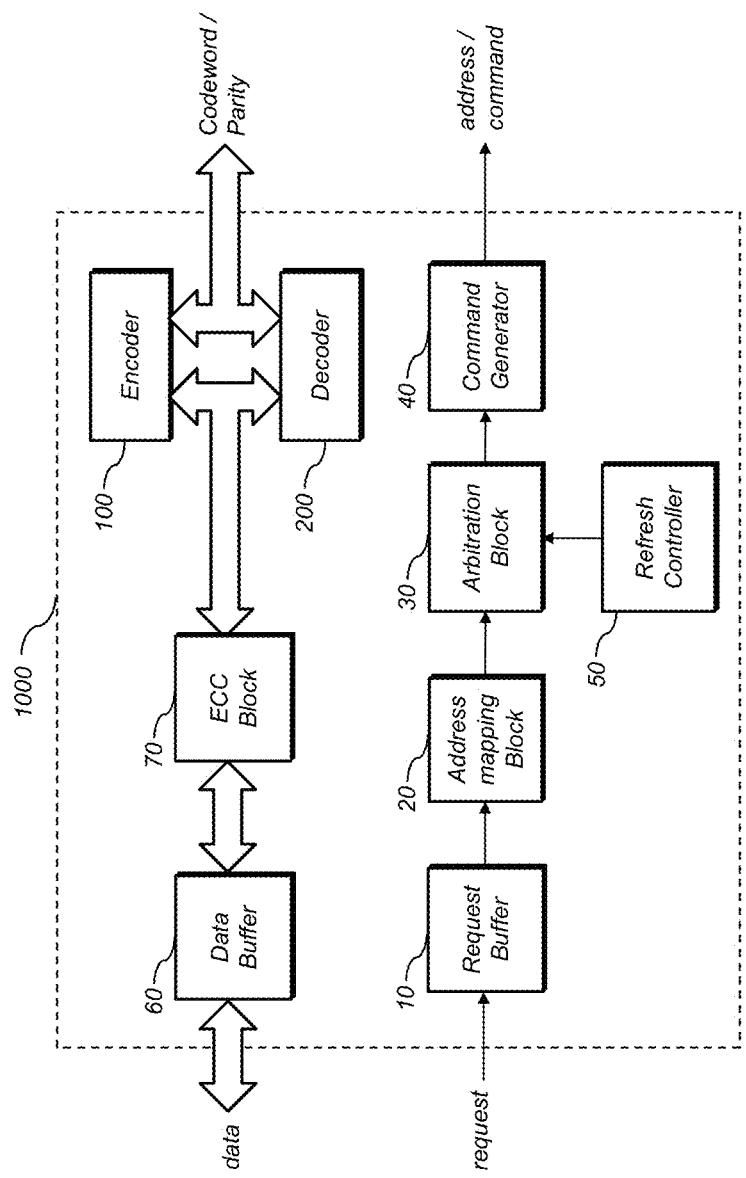
FIG. 10 is a block diagram of a memory controller in accordance with an embodiment.

FIG. 10 is a block diagram of a memory controller in accordance with an embodiment.

The memory controller 1000 of FIG. 10 may be provided independently or embedded in another semiconductor device such as a processor.

The memory controller 1000 in accordance with the embodiments may include an encoder 100 and a decoder 200. The encoder 100 may encode data requested from a host and provide the encoded data to a semiconductor memory device (not illustrated), and the decoder 200 may decode information provided from the semiconductor memory device and output the decoded information. The configuration of the encoder 100 has been described in detail with reference to FIGS. 4 to 6, and the configuration of the decoder 200 has been described in detail with reference to FIGS. 7 to 9. Thus, the detailed descriptions thereof are omitted herein.

The memory controller 1000 in accordance with the embodiments may further include a request buffer 10, an address mapping block 20, an arbitration block 30, a command generator 40, a refresh controller 50, and a data buffer 60. Since the operations of the respective components are well-known, the detailed descriptions thereof are omitted herein.

The memory controller 1000 in accordance with the embodiments may further include an ECC block 70 between the data buffer 60 and the encoder 100 and the decoder 200, in order to perform error correction coding. However, the ECC block 70 is a component which is generally included in a conventional memory controller, and has nothing to do with the above-described error correction function for crossover. Thus, when the error correction function is performed with the encoder 100 and the decoder 200, the ECC block 70 may be omitted.

The time required for the encoder 100 and the decoder 200 to perform an encoding and decoding operation may be previously set through a test. Thus, the memory controller 1000 in accordance with the embodiments may consider the encoding and decoding time when determining the scheduling timing.

Figure 11:
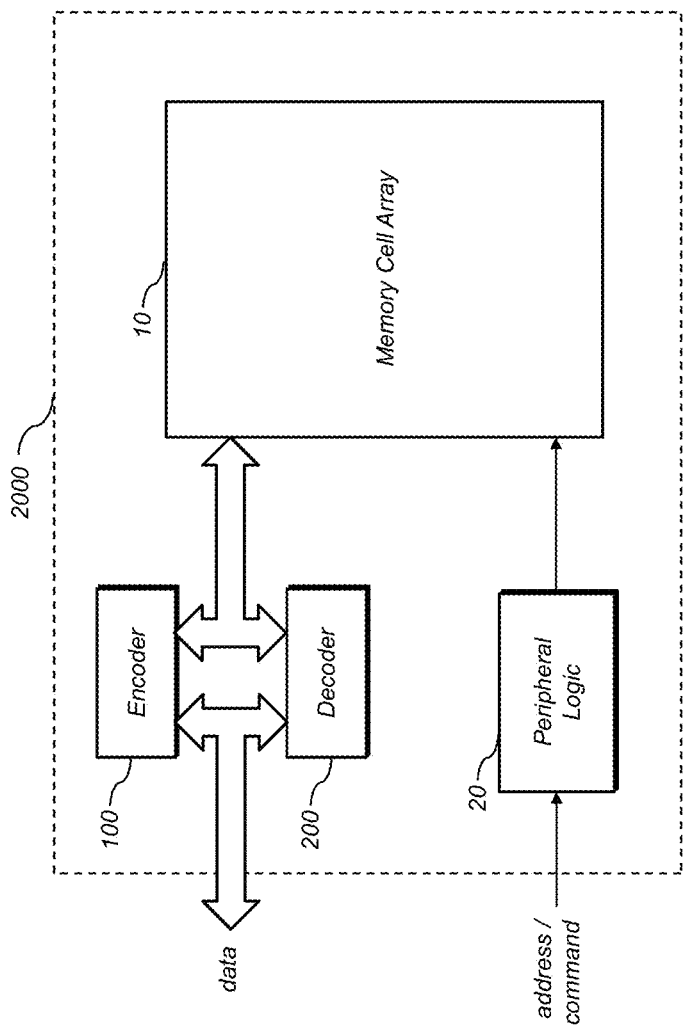
FIG. 11 is a block diagram of a semiconductor memory device in accordance with an embodiment.

FIG. 11 is a block diagram of a semiconductor memory device in accordance with an embodiment.

The semiconductor memory device 2000 in accordance with the embodiments may include an encoder 100 and a decoder 200. The encoder 100 may encode data provided from a memory controller (not illustrated) and provided the encoded data to a memory cell array 10, and the decoder 200 may decode information read from the memory cell array 10 and provide the decoded information to the memory controller.

The configuration of the encoder 100 has been described in detail with reference to FIGS. 4 to 6, and the configuration of the decoder 200 has been described in detail with reference to FIGS. 7 to 9. Thus, the detailed descriptions thereof are omitted.

The semiconductor memory device 2000 in accordance with the embodiments may further include a peripheral logic circuit 20 configured to analyze an address and command provided from the memory controller and control the cell array 10. Since the peripheral logic circuit 20 is a well-known component, the detailed descriptions thereof are omitted herein.

The operation principle of the semiconductor memory device 2000 may be maintained in substantially the same manner, except that the encoder 100 and the decoder 200 additionally perform conversion between data and codewords.

FIG. 12 illustrates a simulation result showing the effect of the embodiments.

The present simulation was performed through a "MATLAB" under the supposition that the encoder 100 and the decoder 200 are included in a memory controller to control PCRAM. In the present simulation, redundancy required for satisfying $BER=10^{-15}$ was measured, and the measurement result was displayed in a percentage (%). With the decrease of redundancy, the number of additional information (cells)

required to store the same data decreases. Thus, when the redundancy is small, it may indicate that the result is excellent.

Example 1 corresponds to a case in which anti-drift coding is not used. That is, the encoder 100 and the decoder 200 are not included in the configuration of FIG. 10, but only the ECC block 70 is provided in the data path.

Example 2 corresponds to a case which only anti-drift coding is performed within the encoder 100 and the decoder 200 of FIG. 10 and error correction coding is not separately performed. That is, the ECC block 70, the encoder 100, and the decoder 200 are included in the data path of FIG. 10, but the encoder 100 and the decoder 200 do not include the second encoding unit 120 and the second decoding unit 220, respectively.

Referring to FIG. 12, it can be seen that the embodiments as discussed have the lowest redundancy rate, under the supposition that the same refresh period is given. Furthermore, Prior Art 2 which uses anti-drift coding exhibits a much higher redundancy rate than Prior Art 1 which does not use anti-drift coding. As described with reference to FIG. 3, an error bit number may be significantly increased in data obtained by decoding a codeword due to a crossover.

In accordance with the embodiments, it may be possible to normally recover data through the encoder, the decoder, and the semiconductor device including the same.

Although various embodiments have been described for illustrative purposes, it will be apparent to those skilled in the art that various changes and modifications may be made without departing from the spirit and scope of the embodiments as defined in the following claims.

What is claimed is:

1. A semiconductor device comprising:
   a first encoding unit configured to encode first data into an anti-drift code; and
   a second encoding unit configured to add parity information to the anti-drift code,
   wherein the first data may be recovered from a data including the anti-drift code and a drift noise generated while the anti-drift code is stored in a semiconductor memory device.

2. The semiconductor device of claim 1, wherein the anti-drift code comprises M different symbols, each of which includes N symbols,
   wherein M and N are natural numbers.

3. The semiconductor device of claim 2, wherein binary data corresponding to the symbol comprises a gray code.

4. The semiconductor device of claim 2, wherein the second encoding unit analyzes the anti-drift code in units of a symbol to add the parity information.

5. The semiconductor device of claim 1, wherein the second encoding unit analyzes the anti-drift code in units of a bit to add the parity information.

6. The semiconductor device of claim 5, wherein when the number of bits of an added parity information is an odd number of bits, the second encoding unit adds one arbitrary bit to the parity information such that the number of bits of the parity information becomes an even number of bits.

7. The semiconductor device of claim 1, wherein the semiconductor device further receives second data which are not converted into an anti-drift code, and the second encoding unit adds the parity information to the second data and the anti-drift code.

8. A semiconductor device which decodes an input data including an anti-drift code obtained by encoding first data, parity information on the anti-drift code, and drift noise, comprising:
   a first decoding unit configured to recover the anti-drift code from the input data and recover the parity information by referring to the recovery information;
   a second decoding unit configured to output an error-corrected anti-drift code from the recovered parity information and the recovered anti-drift code; and
   a third decoding unit configured to decode the error-corrected anti-drift code and output the first data.

9. The semiconductor device of claim 8, wherein the anti-drift code comprises M different symbols, each of which includes N symbols,
   wherein M and N are natural numbers.

10. The semiconductor device of claim 9, wherein binary data corresponding to the symbol comprises a gray code.

11. The semiconductor device of claim 9, wherein the parity information is obtained by analyzing the anti-drift code in units of symbol.

12. The semiconductor device of claim 8, wherein the parity information is obtained by analyzing the anti-drift code in units of bit.

13. The semiconductor device of claim 8, wherein the input data further comprises second data which are not encoded into an anti-drift code and drift noise of the second data.

14. The semiconductor device of claim 13, wherein the first decoding unit recovers the second data by referring to the recovery information, and the second decoding unit outputs the error-corrected anti-drift code and the error-corrected second data by referring to the parity information.

15. A semiconductor device comprising:
    an encoder configured to encode data provided from a host into an anti-drift code, add parity information to the anti-drift code, and output the anti-drift code and the parity information; and
    a decoder configured to recover the anti-drift code and the parity information from information outputted from a semiconductor memory device, generate the error-corrected anti-drift code using the recovered parity information, and decode and output the anti-drift code,
    wherein the data from the host may be recovered from the anti-drift code and a drift noise generated while the anti-drift code is stored in the semiconductor memory device.

16. The semiconductor device of claim 15, wherein the anti-drift code comprises M different symbols, each of which includes $N_k$ symbols,
    wherein M, k, and $N_k$ are natural numbers, and
    wherein k is greater than or equal to one and M is greater than or equal to k ($1 \leq k \leq M$).

17. The semiconductor device of claim 16, wherein binary data corresponding to the symbol comprises a gray code.

18. The semiconductor device of claim 15, wherein the encoder comprises:
    a first encoding unit configured to encode first data into an anti-drift code; and
    a second encoding unit configured to add parity information to the anti-drift code.

19. The semiconductor device of claim 18, wherein the decoder comprises:
    a first decoding unit configured to recover the anti-drift code from the output information and recover the parity information by referring to the recovery information;
    a second decoding unit configured to output an error-corrected anti-drift code from the recovered parity information and the recovered anti-drift code; and
    a third decoding unit configured to decode the error-corrected anti-drift code and output the first data.

20. The semiconductor device of claim 18, wherein the second encoding unit adds the parity information to the anti-drift code and second data which are not encoded into an anti-drift code, and the first decoding unit further recovers the second data by referring to the recovery information, and the second decoding unit further outputs the error-corrected second data from the parity information.

21. The semiconductor device of claim 18, wherein when a number of bits of an added parity information is an odd number of bits, the second encoding unit adds one arbitrary bit to the parity information such that the number of bits of the parity information becomes an even number of bits.

22. A semiconductor memory device comprising:
a memory cell array;
an encoder configured to encode data provided from a memory control device into an anti-drift code, add parity information to the anti-drift code, and provide the anti-drift code to the memory cell array; and
a decoder configured to recover the anti-drift code and the parity information from information outputted from the memory cell array, generate the error-corrected drift code using the recovered parity information, and decode and output the drift code,
wherein the data provided from the memory control device may be recovered from the anti-drift code and a drift noise generated while the anti-drift code is stored in the semiconductor memory device.

23. The semiconductor device of claim 22, wherein the anti-drift code comprises M different symbols, each of which includes N includes $N_k$ symbols, wherein M, k, and $N_k$ are natural numbers, and
wherein k is greater than or equal to one and M is greater than or equal to k ($1 \leq k \leq M$).

24. The semiconductor device of claim 23, wherein binary data corresponding to the symbol comprises a gray code.

25. The semiconductor device of claim 22, wherein the encoder comprises:
a first encoding unit configured to encode first data into an anti-drift code; and
a second encoding unit configured to add parity information to the anti-drift code.

26. The semiconductor device of claim 25, wherein the decoder comprises:
a first decoding unit configured to recover the anti-drift code from the output information and recover the parity information by referring to the recovery information;
a second decoding unit configured to output an error-corrected anti-drift code from the recovered parity information and the recovered anti-drift code; and
a third decoding unit configured to decode the error-corrected anti-drift code and output the first data.

27. The semiconductor device of claim 26, wherein the second encoding unit adds the parity information to the anti-drift code and second data which are not encoded into an anti-drift code, and the first decoding unit further recovers the second data by referring to the recovery information, and the second decoding unit further outputs the error-corrected second data from the parity information.

* * * * *